(12) United States Patent
Gmür

(10) Patent No.: US 6,764,924 B2
(45) Date of Patent: Jul. 20, 2004

(54) PROCESS FOR PRODUCING A TOOL INSERT FOR INJECTION MOLDING A PART WITH SINGLE-STAGE MICROSTRUCTURES

(75) Inventor: Max Gmür, Mosnang (CH)

(73) Assignee: Weidmann Plastics Technology AG (CH)

( * ) Notice: Subject to any disclaimer, the term of this patent is extended or adjusted under 35 U.S.C. 154(b) by 0 days.

(21) Appl. No.: 10/720,852

(22) Filed: Nov. 24, 2003

(65) Prior Publication Data
US 2004/0104507 A1 Jun. 3, 2004

(30) Foreign Application Priority Data
Nov. 25, 2002 (EP) .............................. 02079900

(51) Int. Cl.⁷ ............................... H01L 21/30

(52) U.S. Cl. ................. 438/455; 438/458; 438/459

(58) Field of Search ................. 438/455–459

(56) References Cited
U.S. PATENT DOCUMENTS
2002/0098611 A1    7/2002  Chang et al.
2003/0080472 A1 *  5/2003  Chou ......................... 264/338

OTHER PUBLICATIONS

Olsson et al., Valve–Less Diffuser Micropumps Fabricated Using Thermoplastic Replication:, Micro Electro Mechanical Systems, 1997. MEMS'97, Proceedings, IEEE., Jan. 26, 1997.

* cited by examiner

Primary Examiner—H. Jey Tsai
(74) Attorney, Agent, or Firm—Gibbons, Del Deo, Dolan, Griffinger & Vecchione

(57) ABSTRACT

Process for producing a tool insert for injection molding a part which is produced from a synthetic material, a metal or a ceramic material and which comprises an arrangement of microstructures which are formed on an outer surface of the part and have a predetermined depth. The process comprises the following steps:

photo-lithographically masking the front side of a first wafer with a first etching mask which corresponds to an arrangement of microstructures, microstructuring the first wafer by means of plasma etching the front side of the first wafer to form an arrangement of microstructures, the depth of which extends over the entire thickness of the first wafer, so that the microstructures form cavities which have an orifice on the front side and on the rear side of the first wafer respectively, removing the first etching mask from the front side of the first wafer, bonding the front side of the first wafer to a carrier substrate to form a master, electrochemically depositing a metal layer on the rear side of the first wafer and in the cavities which are present therein and are formed by the microstructures, and separating the metal layer from the master, wherein the separated metal layer can be used as a tool insert for injection molding a part.

16 Claims, 3 Drawing Sheets

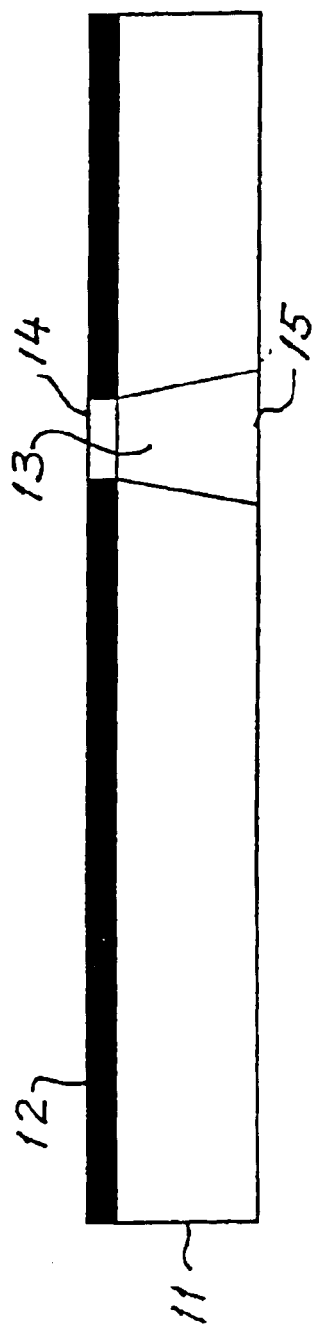
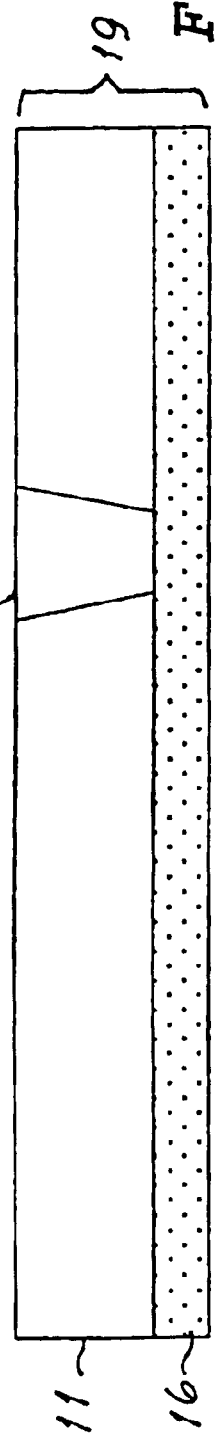
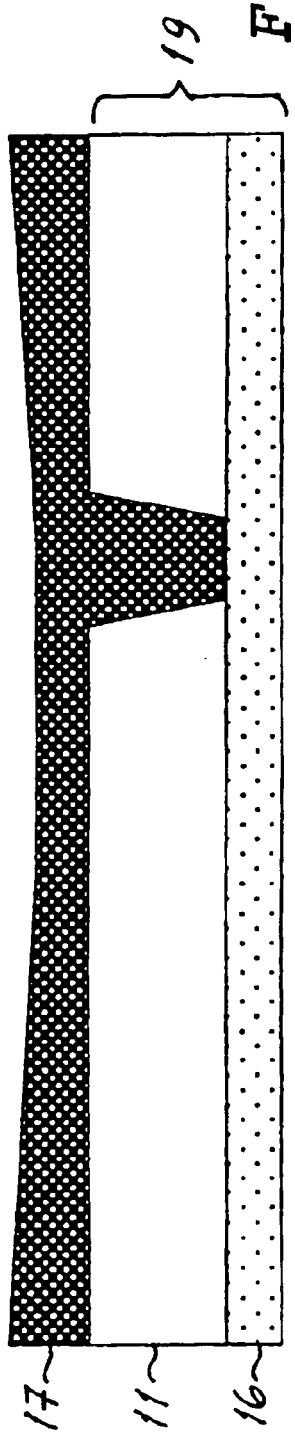

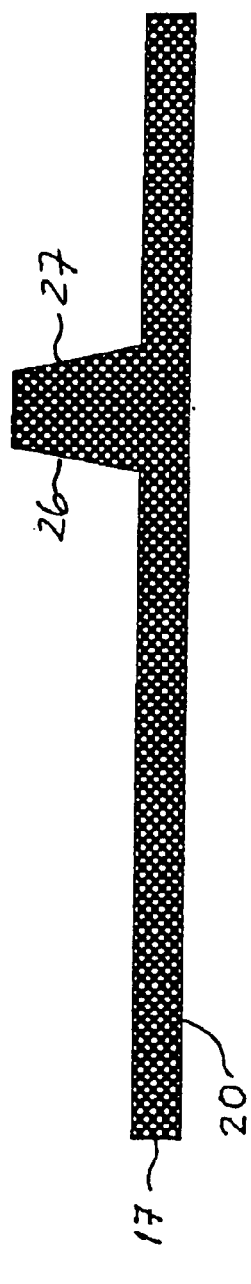
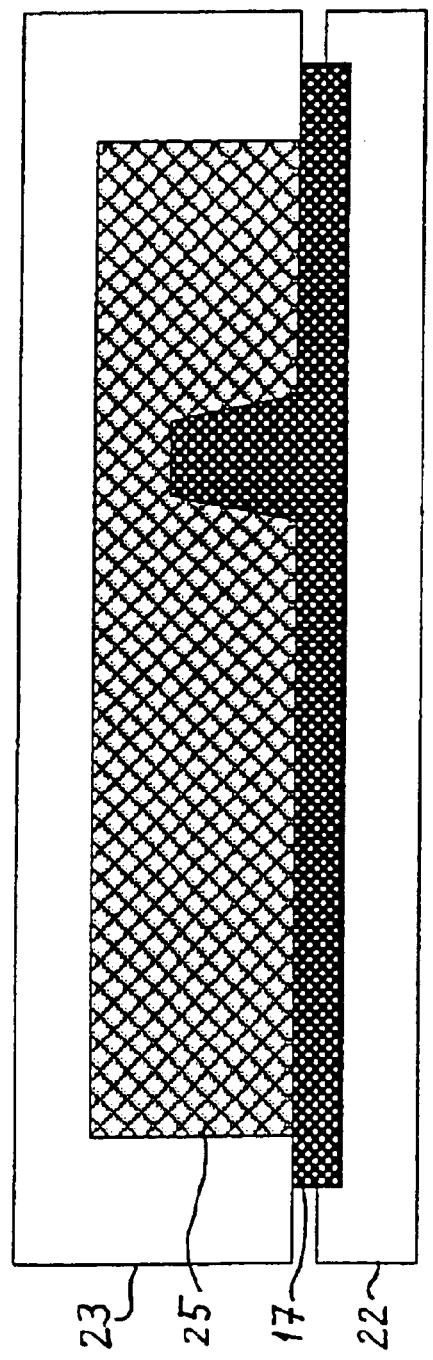

PROCESS FOR PRODUCING A TOOL INSERT FOR INJECTION MOLDING A PART WITH SINGLE-STAGE MICROSTRUCTURES

FIELD OF THE INVENTION

The invention relates to a process for producing a tool insert used in a mold for injection molding a part fabricated of a synthetic material, a metal or a ceramic material and which includes an arrangement of microstructures formed on an outer surface of the part and have a predetermined depth. The invention also relates to an injection molding process for producing a part fabricated of a synthetic material, a metal or a ceramic material using the tool insert.

BACKGROUND OF THE INVENTION

In order to ensure that parts which have been produced by means of injection molding can be removed from the tool after the injection molding process without the quality of the microstructures being impaired and in the case of a large number of microstructures without the removal force being excessive, it is necessary to provide the microstructures with inclined surfaces which enable the part to be removed from the molding tool, which surfaces are inclined, for example, at an angle of greater than two (2) degrees, wherein this angle is measured in the cross-section between a side wall of the microstructure and a plane perpendicular to the outer surface of the part and to the cross-sectional plane.

The following processes are known which render it possible to produce parts with single-stage microstructures:

(A) Wet etching glass
(B) Dry etching silicon
(C) LIGA
(D) UV-LIGA
(E) Laser Machining
(F) Micro erosion
(G) Microcutting (drilling, machining, turning)

However, all of these known microstructuring processes are encumbered with the following disadvantages:

It is only possible to achieve a limited maximum depth of the structure using process (A). Process (B) is difficult to manage. Process (C) is extremely time-consuming and costly. The inclined surface which enables the part to be removed from the molding tool cannot be produced using process (D) or it can only be produced at great expense. The processes (E), (F), (G) have not been sufficiently developed for use in industry and in addition can only be performed in sequence.

SUMMARY OF THE INVENTION

Broadly, one aspect of the present invention relates to a technique for making a portion of a mold having at least one microstructure by etching this microstructure on a wafer, attaching the wafer to a carrier substrate to form a master, depositing a material layer onto the master so that the deposited material extends over the microstructure, and then separating the material layer from the carrier substrate. Another broad aspect of the present invention relates to molding a part using a mold incorporating the mold portion that has been fabricated as described above.

A first aim of the invention is to provide a process for producing a microstructured tool insert of the type mentioned above which in the case of single-stage microstructures provides the inclined surfaces which enable the part to be removed from the molding tool to be produced at a relatively low cost.

According to a first aspect of the invention this first aim is achieved with a first process of the above-mentioned kind which comprises the following steps:

(a) photo-lithographically masking the front side of a first wafer with a first etching mask which corresponds to an arrangement of microstructures,
(b) micro-structuring the first wafer by means of plasma etching the front side of the first wafer to form an arrangement of microstructures which form cavities and whose depth extends over a part of the thickness of the first wafer,
(c) removing the first etching mask from the front side of the first wafer,
(d) bonding the front side of the first wafer to a carrier substrate to form a master,
(e) removing a layer of the first wafer to reveal the microstructures which have not been through-etched and to set the depth of the microstructures,
(f) applying an electrically conductive thin layer to the rear side of the first wafer and to the carrier substrate surfaces which can be accessed through the cavities mentioned,
(g) electrochemically depositing a metal layer on the rear side of the first wafer and in the cavities which are present therein and are formed by the microstructures,
(h) making planar the outer surface of the deposited metal layer, and
(i) separating the metal layer from the master, wherein the separated metal layer can be used as a tool insert for injection molding a part.

According to a second aspect of the invention the above-mentioned first aim is achieved with a second process of the above-mentioned kind which comprises the following steps:

(a) photo-lithographically masking the front side of a first wafer with a first etching mask which corresponds to an arrangement of microstructures,
(b) microstructuring the first wafer by means of plasma etching the front side of the first wafer to form an arrangement of microstructures, the depth of which extends over the entire thickness of the first wafer, so that the microstructures form cavities which have an orifice on the front side and on the rear side of the first wafer respectively,
(c) removing the first etching mask from the front side of the first wafer,
(d) bonding the front side of the first wafer to a carrier substrate to form a master,
(e) applying an electrically conductive thin layer to the rear side of the first wafer and to the carrier substrate surfaces which can be accessed through the cavities mentioned,
(f) electrochemically depositing a metal layer on the rear side of the first wafer and in the cavities which are present therein and are formed by the microstructures,
(g) making planar the outer surface of the deposited metal layer, and
(h) separating the metal layer from the master, wherein the separated metal layer can be used as a tool insert for injection molding a part.

In preferred embodiments of the above-mentioned first and second processes the first wafer is a silicon wafer.

In preferred embodiments of the above-mentioned first and second processes the carrier substrate is a glass wafer having a high sodium content, e.g. one fabricated from Pyrex® glass.

In other preferred embodiments of the above-mentioned first and second processes the carrier substrate is a silicon wafer.

In preferred embodiments of the above-mentioned first and second processes the deposited metal layer is a nickel layer.

In preferred embodiments of the above-mentioned first and second processes the microstructuring of the front side of the first wafer is performed by means of through-etching the first wafer with an undercut, so that the microstructures formed have a cross-section whose width increases with the distance to the front side of the first wafer.

Moreover, a second aim of the invention is to provide a process for injection molding a part which comprises an arrangement of microstructures which are formed on an outer surface of the part, have a predetermined depth and comprise inclined surfaces which enable the part to be removed from the molding tool, wherein a tool for injection molding is used which is formed from a first and a second tool half.

According to a third aspect of the invention the above-mentioned second aim is achieved with a third process of the above-mentioned kind which comprises the following steps:
  (a) installing a first tool insert as a first tool half which serves to shape the arrangement of microstructures, wherein the first tool insert is produced according to according to a process of the above-mentioned kind,
  (b) installing a second tool insert as a second tool half which is arranged opposite the first tool half,
  (c) closing the tool formed from the first and second tool insert for injection molding,
  (d) injecting a material melt into the cavity between the first and the second tool insert,
  (f) cooling the injected material melt and
  (g) ejecting from the molding tool for injection molding a part which is formed by the setting of the injected material melt and which comprises microstructures with inclined surfaces which enable the part to be removed from the molding tool.

The advantages achieved using the processes in accordance with the invention are as follows:

The process in accordance with the invention renders it possible in a convenient and inexpensive manner to produce inclined surfaces which enable the part to be removed from the molding tool and which are inclined at an angle greater than two (2) degrees. An important advantage of such inclined surfaces which enable the part to be removed from the molding tool is that they render it possible for the part to be removed from the molding tool without impairing the quality of the microstructures and for the forces required to remove the part from the molding tool to be low, even if the wafer comprises many microstructures.

The process in accordance with the invention obviates one disadvantage of dry etching silicon using the Bosch process, the fundamental undercutting of the structures.

The process in accordance with the invention has the additional advantage that uniformity of the depth of the etching is achieved through the thickness of the wafer and as a consequence is excellent, which is otherwise not the case when dry etching silicon in particular when the orifices are of different widths.

BRIEF DESCRIPTION OF THE DRAWINGS

The subject invention will now be described in terms of its preferred embodiments with reference to the accompanying drawings. These embodiments are set forth to aid the understanding of the invention, but are not to be construed as limiting.

FIG. 1 shows the microstructuring of the front side of a first wafer performed by through-etching using plasma etching to form an arrangement of microstructures, FIG. 2 shows the bonding of the front side of the first wafer to a carrier substrate to form a Galvano master, FIG. 3 shows the electrochemical deposition of a metal layer on the front side of the first wafer and in the cavities provided therein and formed by the through-going microstructures, FIG. 4 shows the metal layer separated from the first wafer and the carrier substrate bonded thereto, FIG. 5 illustrates the use of a metal layer separated from the first wafer and from the carrier substrate bonded thereto as a shaping part of a tool insert which is produced in accordance with the invention and is used as a tool half of a tool for injection molding a part, and the injection of a material melt into the inner cavity of the injection molding tool.

DETAILED DESCRIPTION OF PREFERRED EMBODIMENTS

Figure 6:
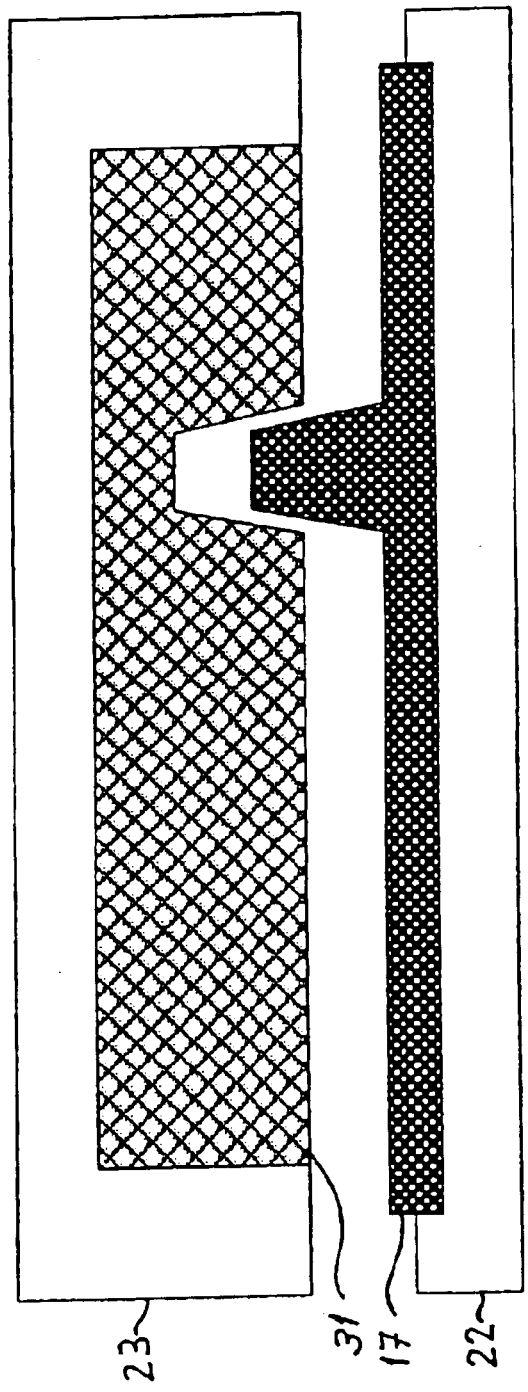
FIG. 6 illustrates the removal from a molding tool of a part from the metal layer just mentioned.

Referring to FIGS. 1 to 4, a process for producing a microstructured tool insert for injection molding a synthetic material part is described below, which part comprises an arrangement of microstructures which are formed on an outer surface of the synthetic material part and have a predetermined depth. This process can also be used for injection molding a part which is produced from a metal or from a ceramic material.

As illustrated in FIG. 1, in a first process step the front side of a silicon wafer 11 is masked photo-lithographically using an etching mask 12 which corresponds to an arrangement of microstructures.

Subsequently, the wafer 11 is through-etched by means of dry etching in a plasma (technical term: DRIE=Deep Reactive Ion Etching) consisting of ions and reactive fluorine radicals with a so-called through-etching, wherein the fluorine radicals remove the silicon. For this purpose the recipe of the etching means is selected such that the undercut corresponds to the desired inclined surface which enables the part to be removed from the molding tool. This requirement can be fulfilled insofar as the silicon etching process based on the Bosch process is inclined to undercut, in particular where the width of the etching orifice is greater than 20 micrometer. This effect is exploited in accordance with the invention to generate the desired inclined surface which enables the part to be removed from the molding tool.

In this manner an arrangement of microstructures is produced in the silicon wafer 11 starting from the front side of the silicon wafer, the depth of these microstructures extends over the entire thickness of the first wafer so that the microstructures produced in this manner form cavities 13, which have on the front side an orifice 14 and on the rear side of the first wafer an orifice 15 respectively. The silicon wafer 11 has, for example, a thickness of 250 micrometer.

Subsequently the etching mask 12 is removed from the front side of the silicon wafer 11, the wafer 11 is turned and the front side of the silicon wafer 11, as illustrated in FIG. 2, is bonded to a carrier substrate 16 in order to increase the intrinsic stability and to seal the rear side of the wafer 11 so that nickel can be applied electrochemically. A so-called Galvano master 19 is formed by bonding the wafer 11 and carrier substrate 16 in this manner.

In one variant of the process described above, an arrangement of microstructure is produced starting from the front side of the silicon wafer 11, these microstructures form cavities and their depth extends over only a part of the thickness of the wafer 11. In this case, after removing the etching mask 12 and providing a bond between the front side of the wafer 11 and the carrier substrate 16 a layer of the wafer 11 is removed to reveal the microstructures which have not been through-etched and to set the depth of the microstructures which then extend over the entire remaining thickness of the wafer 11.

Both Pyrex® glass wafers (glass with a high proportion of sodium) and also silicon wafers are suitable as the carrier substrate 16.

Pyrex® glass wafers are inseparably connected by means of anodic bonding to the microstructured silicon wafer. During the anodic bonding process a high voltage, for example, of 1000 V is applied to the silicon and Pyrex® glass wafers which are laid one on top of the other. Sodium ions diffuse from the Pyrex® glass into the silicon and produce a high-strength ionic connection between the Pyrex® glass and silicon. The diffusion is in addition accelerated by increasing the temperature of the wafer, for example, to 400° C.).

Silicon wafers are inseparably connected by means of silicon fusion bonding to the microstructured silicon wafer. During the silicon fusion bonding, the surfaces to be connected on the silicon substrate and the microstructured silicon wafer are conditioned and subsequently covalently bonded under pressure and at a temperature provided that the two surfaces to be connected demonstrate an extremely low degree of roughness (less than 0.5 nanometer), so that the two surfaces come into direct contact with each other.

The next process step is to provide the microstructured silicon wafer 11 together with the carrier substrate 16, together referred to as the master 19, with a thin conductive layer which serves as the start layer for the electrochemical deposition described below. Gold, silver and nickel, for example, are suitable and they are physically applied by means of a sputtering process (also known under the term 'cathode atomization') or vapor deposition after coating with an adhesive layer of aluminum, titanium or chromium.

Subsequently, as illustrated in FIG. 3, the master 19 is electrically contacted via the conductive start layer and a thick metal layer 17, preferably a nickel layer, is deposited electrochemically to form a mechanically stable backing plate with a thickness, for example, of 1 millimeter.

Following the above mentioned deposition, for example, of a nickel layer 17, also called nickel shim, the rear side 20 of the nickel shim is first made planar. Suitable processes are eroding and polishing. Subsequently, the microstructured nickel tool insert 17 (hereinafter referred to as the 'shim') must be separated from the master 19. For this purpose, the master 19 is either mechanically separated from the shim 17 or dissolved in a suitable wet etching chemical process or by means of a dry etching process. FIG. 4 illustrates the separate nickel shim 17 with a rear side 20 which has been made planar.

The separated metal layer 17 can be used as a shaping part of a tool insert produced in accordance with the invention and has lateral outer surfaces 26, 27 which render it possible to produce the inclined surfaces which enable the part to be removed from the molding tool and which are at an angle, for example, of greater than 2 degrees.

Figure 7:
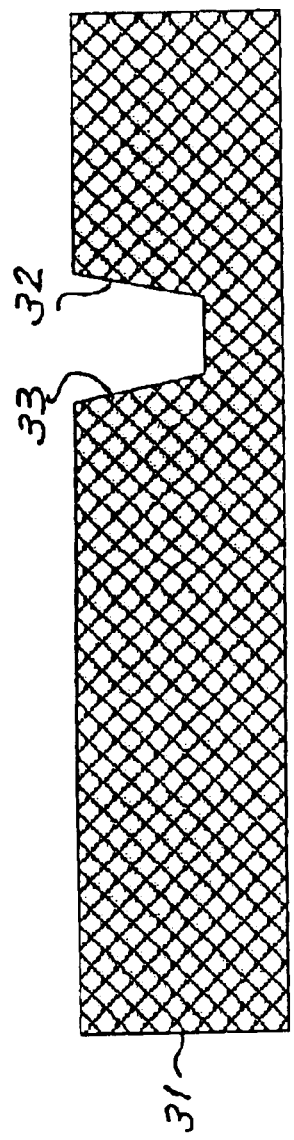
FIG. 7 shows the part removed from the injection molding tool.

A process for injection molding a synthetic material part is described below with reference to FIGS. 5 to 7.

For the purpose of injection molding a synthetic material part the nickel shim 17 is installed in a tool half 22 which is disposed opposite a second tool half 23 of the injection molding tool. The injection molding tool is closed and a synthetic material melt 25 is injected into the inner cavity of the injection molding tool.

Once the synthetic material melt 25 has set rigid and the injection molding tool has been opened the synthetic material part 31 can be removed from the shim with only a small amount of force. Advantageously, the quality of the microstructures is not impaired and also when the wafer has many microstructures only a small amount of force is required to remove the synthetic material part. A further advantage of the above described process is that as a consequence microstructures which have an extremely good degree of uniformity in depth can be produced.

The synthetic material part 31 has microstructures with lateral inner surfaces 32, 33 which comprise inclined surfaces which enable the part to be removed from the molding tool and which are, for example, greater than 2 degrees.

In more general terms the process described above is a process for producing a portion of a mold, the mold being used to make a part having at least one microstructure formed on a surface thereof, and the process comprises:

(a) etching the microstructure on a wafer (b) attaching the wafer to a carrier substrate to form a master, (c) depositing a material layer onto the master, the deposited material layer extending over the microstructure, and (d) separating the deposited metal layer from the master, wherein the separated metal layer can be used as the predetermined mold portion.

In a preferred embodiment, the microstructure etched on the wafer extends downwardly from a first surface of the wafer.

In a preferred embodiment, the wafer is attached to the carrier substrate with the first surface being adjacent to a second surface of the carrier substrate.

Although preferred embodiments of the invention have been described using specific terms, such description is for illustrative purposes only, and it is to be understood that changes and variations may be made without departing from the spirit or scope of the following claims.

What is claimed is:

1. A process for producing a tool insert used in a mold for injection molding a part fabricated of a synthetic material, a metal or a ceramic material and which includes an arrangement of microstructures formed on an outer surface of the part and have a predetermined depth, said process comprising:

(a) photo-lithographically masking the front side of a first wafer with a first etching mask which corresponds to an arrangement of microstructures, (b) micro-structuring the first wafer by means of plasma etching the front side of the first wafer to form an arrangement of microstructures which form cavities and whose depth extends over a part of the thickness of the first wafer, (c) removing the first etching mask from the front side of the first wafer, (d) bonding the front side of the first wafer to a carrier substrate to form a master, (e) removing a layer of the first wafer to reveal the microstructures which have not been through-etched and to set the depth of the microstructures, (f) applying an electrically conductive thin layer to the rear side of the first wafer and to the carrier substrate surfaces which can be accessed through the cavities mentioned, (g) electrochemically depositing a metal layer on the rear side of the first wafer and in the cavities which are present therein and are formed by the microstructures, (h) making planar the outer surface of the deposited metal layer, and (i) separating the metal layer from the master, wherein the separated metal layer can be used as a tool insert for injection molding a part.

2. The process of claim 1 wherein the first wafer is a silicon wafer.

3. The process of claim 1 wherein the carrier substrate is a glass wafer.

4. The process of claim 1 wherein the carrier substrate is a silicon wafer.

5. The process of claim 1 wherein the deposited metal layer is a nickel layer.

6. The process of claim 1 wherein the microstructuring of the front side of the first wafer is performed by means of through-etching the first wafer with an undercut, so that the microstructures formed have a cross-section whose width increases with the distance to the front side of the first wafer.

7. A process for producing a tool insert used in a mold for injection molding a part which is fabricated from a synthetic material, from a metal or from a ceramic material and which comprises an arrangement of microstructures which are formed on an outer surface of the part and have a predetermined depth, said process comprising:

(a) photo-lithographically masking the front side of a first wafer with a first etching mask which corresponds to an arrangement of microstructures, (b) microstructuring the first wafer by means of plasma etching the front side of the first wafer to form an arrangement of microstructures, the depth of which extends over the entire thickness of the first wafer, so that the microstructures form cavities which have an orifice on the front side and on the rear side of the first wafer respectively, (c) removing the first etching mask from the front side of the first wafer, (d) bonding the front side of the first wafer to a carrier substrate to form a master, (e) applying an electrically conductive thin layer to the rear side of the first wafer and to the carrier substrate surfaces which can be accessed through the cavities mentioned, (f) electrochemically depositing a metal layer on the rear side of the first wafer and in the cavities which are present therein and are formed by the microstructures, (g) making planar the outer surface of the deposited metal layer, and (h) separating the metal layer from the master, wherein the separated metal layer can be used as a tool insert for injection molding a part.

8. The process of claim 7 wherein the first wafer is a silicon wafer.

9. The process of claim 7 wherein the carrier substrate is a glass wafer.

10. The process of claim 7 wherein the carrier substrate is a silicon wafer.

11. The process of claim 7 wherein the deposited metal layer is a nickel layer.

12. The process of claim 7 wherein the microstructuring of the front side of the first wafer is performed by means of through-etching the first wafer with an undercut, so that the microstructures formed have a cross-section whose width increases with the distance to the front side of the first wafer.

13. A process for injection molding a part which is fabricated from a synthetic material, a metal or from a ceramic material and which comprises an arrangement of microstructures which are formed on an outer surface of the part and have a predetermined depth, wherein a tool insert is used in a mold for injection molding, said tool insert being formed from a first and a second tool half, said process comprising:

(a) installing a first tool insert as a first tool half which serves to shape the arrangement of microstructures, wherein the first tool insert is produced by the process of photo-lithographically masking the front side of a first wafer with a first etching mask which corresponds to an arrangement of microstructures, microstructuring the first wafer by means of plasma etching the front side of the first wafer to form an arrangement of microstructures which form cavities and whose depth extends over a part of the thickness of the first wafer, removing the first etching mask from the front side of the first wafer, bonding the front side of the first wafer to a carrier substrate to form a master, removing a layer of the first wafer to reveal the microstructures which have not been through-etched and to set the depth of the microstructures, applying an electrically conductive thin layer to the rear side of the first wafer and to the carrier substrate surfaces which can be accessed through the cavities mentioned, electrochemically depositing a metal layer on the rear side of the first wafer and in the cavities which are present therein and are formed by the microstructures, making planar the outer surface of the deposited metal layer, and separating the metal layer from the master, (b) installing a second tool insert as a second tool half which is arranged opposite the first tool half, (c) closing the tool formed from the first and second tool insert for injection molding, (d) injecting a material melt into the cavity between the first and the second tool insert, (f) cooling the injected material melt and (g) ejecting from the molding tool for injection molding a part which is formed by the setting of the injected material melt and which comprises microstructures with inclined surfaces which enable the part to be removed from the molding tool.

14. A process for injection molding a part which is fabricated from a synthetic material, a metal or from a ceramic material and which comprises an arrangement of microstructures which are formed on an outer surface of the part and have a predetermined depth, wherein a tool insert is used in a mold for injection molding, said tool insert being formed from a first and a second tool half, said process comprising:

(a) installing a first tool insert as a first tool half which serves to shape the arrangement of microstructures, wherein the first tool insert is produced by the process of photo-lithographically masking the front side of a first wafer with a first etching mask which corresponds to an arrangement of microstructures, microstructuring the first wafer by means of plasma etching the front side of the first wafer to form an arrangement of microstructures, the depth of which extends over the entire thickness of the first wafer, so that the microstructures form cavities which have an orifice on the front side and on the rear side of the first wafer respectively, removing the first etching mask from the front side of the first wafer, bonding the front side of the first wafer to a carrier substrate to form a master, applying an electrically conductive thin layer to the rear side of the first wafer and to the carrier substrate surfaces which can be accessed through the cavities mentioned, electrochemically depositing a metal layer on the rear side of the first wafer and in the cavities which are present therein and are formed by the microstructures, making planar the outer surface of the deposited metal layer, and separating the metal layer from the master, (b) installing a second tool insert as a second tool half which is arranged opposite the first tool half, (c) closing the tool formed from the first and second tool insert for injection molding, (d) injecting a material melt into the cavity between the first and the second tool insert, (f) cooling the injected material melt and (g) ejecting from the molding tool for injection molding a part which is formed by the setting of the injected material melt and which comprises microstructures with inclined surfaces which enable the part to be removed from the molding tool.

15. A process for producing a portion of a mold, said mold being used to make a part having at least one microstructure formed on a surface thereof, said process comprising:

(a) etching said microstructure on a wafer (b) attaching said wafer to a carrier substrate to form a master, (c) depositing a material layer onto said master, said deposited material layer extending over said microstructure, and (d) separating the deposited material layer from the master, wherein the separated material layer can be used as the predetermined mold portion.

16. A process for producing a predetermined portion of a mold, said mold being used to make a part having at least one microstructure formed on a surface thereof, said process comprising:

(a) etching said microstructure on a wafer, said microstructure extending downwardly from a first surface of said wafer, (b) attaching said wafer to a carrier substrate to form a master, said wafer being attached to said carrier substrate with said first surface being adjacent to a second surface of said carrier substrate;

(c) depositing a material layer onto said master, said deposited material layer extending over said microstructure, and (d) separating the deposited material layer from the master, wherein the separated material layer can be used as the predetermined mold portion.

* * * * *